United States Patent [19]

Mimotogi et al.

[11] Patent Number: 5,745,388
[45] Date of Patent: Apr. 28, 1998

[54] PROFILE SIMULATION METHOD AND PATTERN DESIGN METHOD

[75] Inventors: Shoji Mimotogi, Sagamihara; Soichi Inoue, Yokohama, both of Japan

[73] Assignee: Kabushiki Kaisha Toshiba, Kawasaki, Japan

[21] Appl. No.: 551,803

[22] Filed: Nov. 7, 1995

[30] Foreign Application Priority Data

Nov. 8, 1995 [JP] Japan .................... 6-273534

[51] Int. Cl.$^6$ .................................... G06F 17/50
[52] U.S. Cl. .................................. 364/578; 364/488
[58] Field of Search ................ 250/492.1, 492.2, 250/492.22; 364/578, 488, 489, 490, 491, 468.28; 216/92

[56] References Cited

U.S. PATENT DOCUMENTS

| | | | |
|---|---|---|---|
| 5,067,101 | 11/1991 | Kinikiyo et al. | 364/578 |
| 5,070,469 | 12/1991 | Kunikiyo et al. | 364/578 |
| 5,282,140 | 1/1994 | Tazawa et al. | 364/468 |
| 5,367,465 | 11/1994 | Tazawa et al. | 364/468 |
| 5,377,118 | 12/1994 | Leon et al. | 364/474.24 |
| 5,379,225 | 1/1995 | Tazawa et al. | 364/468 |
| 5,416,729 | 5/1995 | Leon et al. | 364/578 |

OTHER PUBLICATIONS

Harafuji et al., "Simulation Approach for Achieving Configuration Independent Poly–Silicon Gate Etching," 1995 IEEE, pp. 4.8.1–4.8.4.

Scheckler et al., "Models and Algorithms for Three–Dimensional Topography Simulation with SAMPLE-3D," 1994 IEEE, pp. 219–230.

Toh et al., "Algorithms For Simulation of Three–Dimensional Etching," 1994 IEEE, pp. 616–624.

Journal of Applied Physics, vol. 45, pp. 5264–5268; J.S. Greeneich; Dec. 1974 "Time Evolution of Developed Contours in Poly–(Methyl Methacrylate) Electron Resist".

J.Vac.Technol.B Vol. 3, pp. 434–440; M. P. C. Watts; Feb. 1985 "Analytical Model of Positive Resist Development Applied to Linewidth Control in Optical Lithography".

SPIE, vol. 2197, pp. 501–510; Chris A. Mack; Feb. 1993 "Enhanced Lumped Parameter Model For Photolithography".

*Primary Examiner*—Kevin J. Teska
*Assistant Examiner*—Leigh Marie Garbowski
*Attorney, Agent, or Firm*—Oblon, Spivak, McClelland, Maier & Neustadt, P.C.

[57] ABSTRACT

A profile simulation method of predicting a profile of a surface of a film to be processed which changes when the surface of the film on a substrate is physically or chemically processed, is characterized by comprising the steps of setting a plurality of representative points on the surface of the film before a process, moving the plurality of representative points in a first direction perpendicular to the surface of the film on the substrate in accordance with processing velocities at the plurality of representative points, switching the moving direction of the representative points from the first direction to a second direction parallel to the surface of the film on the substrate, and moving the plurality of representative points in the second direction in accordance with processing velocities at the plurality of representative points, and setting all loci of the plurality of representative points, which have moved from the first direction to the second direction in a predetermined processing time, as paths, and obtaining a envelope or surface for all the paths as a profile after the process.

12 Claims, 6 Drawing Sheets

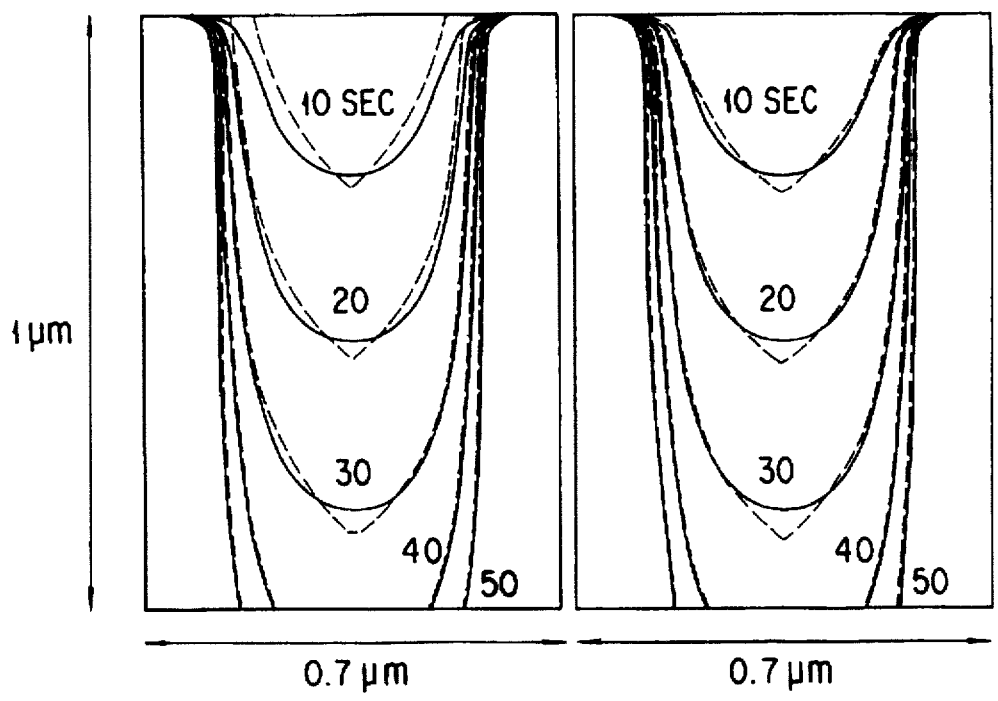
F I G. 4A  F I G. 4B
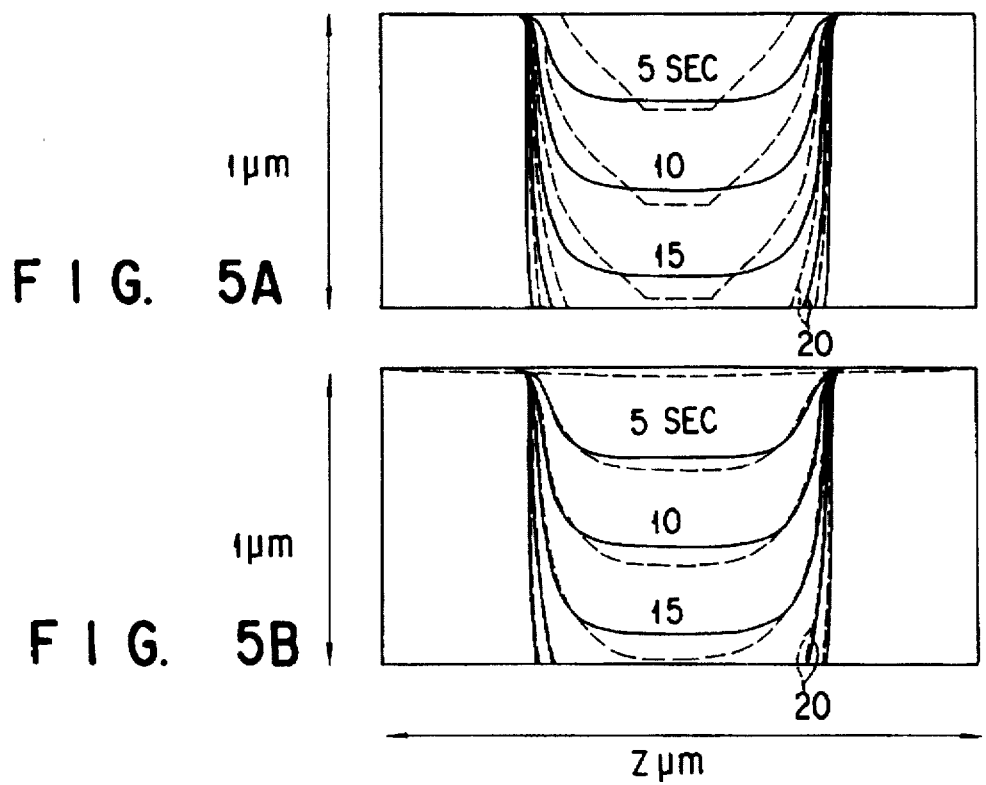
F I G. 5A
F I G. 5B a = 0.775 μm
b = 0.900 μm
c = 0.075 μm
d = 0.250 μm

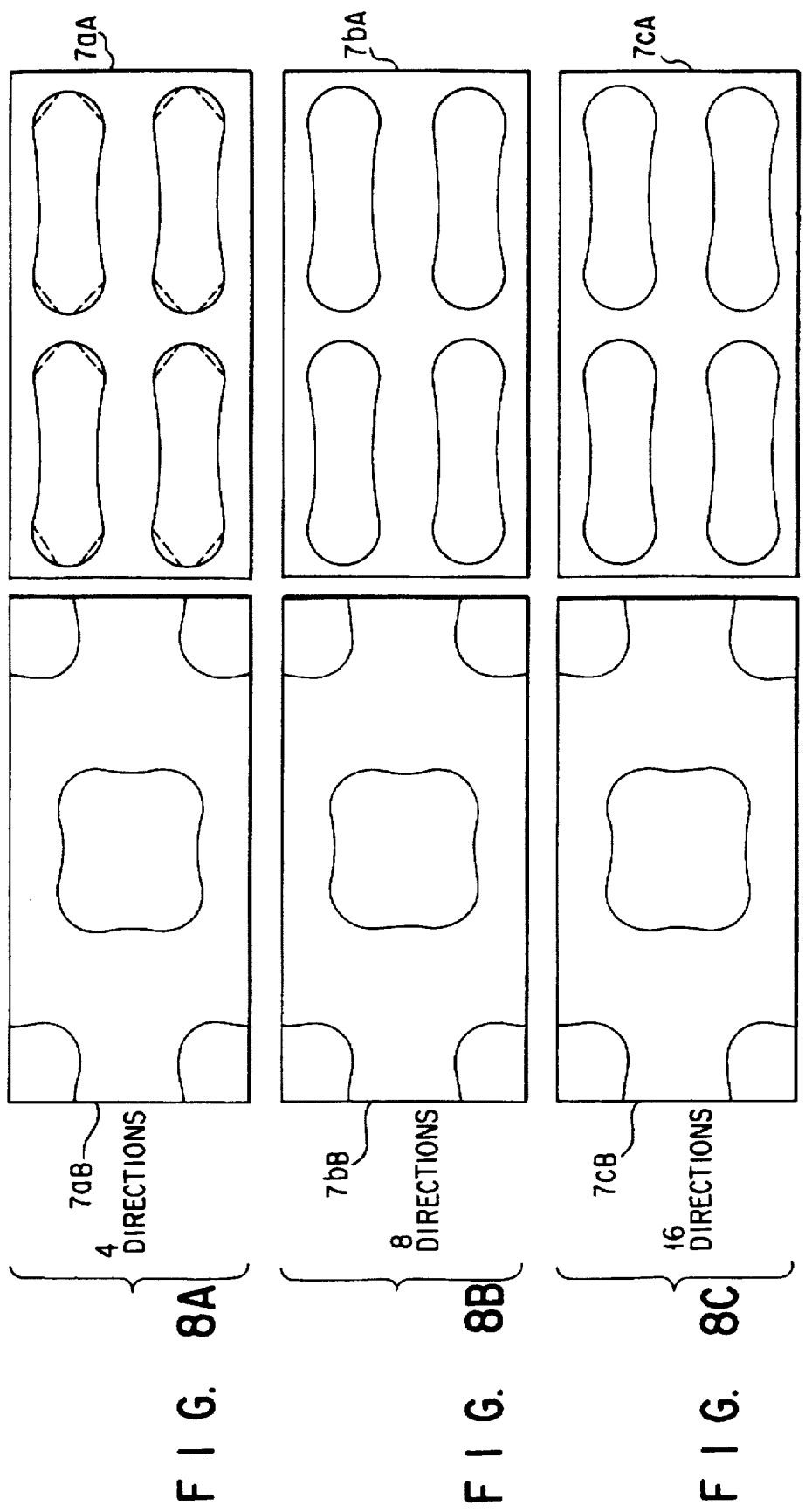

PROFILE SIMULATION METHOD AND PATTERN DESIGN METHOD

BACKGROUND OF THE INVENTION

1. Field of the Invention

The present invention relates to a profile simulation method and a pattern design method and, more particularly, to a profile simulation method suitable for prediction of a change in resist profile which occurs when a developer dissolves the resist in manufacturing, e.g., a semiconductor element by a lithography process, and a pattern design method using the profile simulation method.

2. Description of the Related Art

A semiconductor element or the like is manufactured by a lithography process in the following manner. An image of a mask pattern is projected on a wafer coated with a resist (photosensitive resin layer). The resultant wafer is developed (resist portions with large exposures are dissolved by a developer if the resist is a positive tone resist) to form a resist pattern. The resist pattern having undergone development variously changes depending on the defocus state of the wafer in projecting the image of the mask pattern, exposure conditions (the numerical aperture, the coherence factor, the profile of a light source, the pupil filter, and the like), the developing time, and the mask pattern itself. For this reason, in order to obtain optimal conditions for an optical projection system and a mask pattern which are required to finish a desired pattern having a predetermined depth of focus by experiments, a larger number of exposure experiments must be conducted.

A computer simulation is therefore preferably performed to obtain conditions for an optimal profile of a resist having undergone development in advance. A method of predicting a resist profile after development is known as a resist profile simulation.

As conventional resist profile simulation methods, various methods have been proposed. These methods will be briefly described below.

In a string model, a resist profile is expressed by a series of minute line segments in handling only two-dimensional profiles, whereas a resist profile is expressed by a series of minute surface elements in handling three-dimensional profiles. In this case, the moving direction of a minute line segment or minute surface element is assumed to be perpendicular to a surface. A method of obtaining a moving direction by solving differential equations similar to the differential equations of the light rays is called a ray-tracing model.

A cell-removable model is also known. In this model, an object is divided into an aggregate of minute cells, and a change in profile is expressed by the loss or adhesion of cells from or to the object surface. In a distribution function method which is also available, an object profile is expressed by the envelope of a distribution function, and a change in profile with time is obtained by solving a differential equation similar to a diffusion equation.

A simple ray-tracing model is also known. According to this simple method, it is assumed that, in a developing process, development progresses from a point at which the dissolution ratio is highest on the resist surface, as a start point, in a direction perpendicular to a substrate, and then progresses in a direction parallel to the surface from a point to which the development has proceeded by a given distance, and the developing direction may be switched at all points in directions perpendicular to the substrate. Under these assumptions, a set of end points is obtained as a profile after the development.

These methods, however, have the following problems.

When the string model or the ray-tracing model is used, minute line segments or minute surface elements sometimes form a loop. This loop must be eliminated. In the model extended to three dimensions, the presence/absence of loops must be checked with respect to a large number of minute surface elements, and hence a very complicated algorithm is required. In addition, the calculation cost greatly increases.

In the cell-removable model, a profile in a direction oblique to a side of a cell cannot be properly expressed. In addition, the moving velocity must be corrected in accordance with the number of exposed cell surfaces. In this case, since it is difficult to form a physically distinct model, a problem is posed in terms of reliability.

In the distribution function method, the movement of an object surface is made to correspond to an actual physical phenomenon by correcting a diffusion equation for a heat conduction problem or the like, and hence can be accurately calculated. However, the calculation cost is very high. Therefore, this method is not suitable for the optimization of conditions for an optical projection system and a mask pattern.

According to the simple ray-tracing model, since limitations are imposed on the start point of the movement of an object surface and its moving direction, the calculation cost is much lower than that in each of the remaining models. However, the precision sometimes becomes poor because the limitations are too strong.

As described above, various kinds of resist profile simulation methods have been proposed. However, none of these methods could satisfy both calculation cost and precision requirements. For example, the distribution function method is superior in precision to the remaining methods, but has a high calculation cost. The simple ray-tracing model is superior in calculation cost to the remaining methods, but has poor precision.

SUMMARY OF THE INVENTION

It is an object of the present invention to provide a profile simulation method which can predict the profiles of processed two- and three-dimensional films with desired precision in a short calculation time.

In order to achieve the above object, the present invention has the following arrangements.

According to the present invention, there is provided a profile simulation method which predicts a profile of a surface of a film to be processed which changes when the surface of the film on a substrate is physically or chemically processed, is characterized by comprising the steps of: setting a plurality of representative points on the surface of the film before a process; moving the plurality of representative points in a first direction perpendicular to the surface of the film on the substrate in accordance with processing velocities at the plurality of representative points; switching the moving direction of the representative points from the first direction to a second direction parallel to the surface of the film on the substrate, and moving the plurality of representative points in the second direction in accordance with processing velocities at the plurality of representative points; and setting all loci of the plurality of representative points, which have moved from the first direction to the second direction in a predetermined processing time, as paths, and obtaining an envelope or surface for all the paths as a profile after the process. With regard to a resist, in particular, a method is characterized by comprising the steps of: setting a plurality of representative points on the surface of the photosensitive resin layer before the developing process; moving the plurality of representative points in a first direction perpendicular to the surface of the photosensitive resin layer in accordance with processing velocities at the plurality of representative points; switching the moving direction of the representative points from the first direction to a second direction parallel to the surface of the photosensitive resin layer in accordance with processing velocities at the plurality of representative points, the second direction including at least eight directions; and setting all loci of the plurality of representative points, which have moved from the first direction to the second direction in a predetermined processing time, as paths, and obtaining an envelope or surface for all the paths as a profile after the process.

There is provided a pattern design method using the above profile simulation method is characterized by comprising the steps of: inputting a profile of a desired pattern to be formed on a substrate; calculating an optical image of the pattern on the basis of the profile of the pattern; setting a plurality of representative points on a surface of the substrate on the basis of the optical image, and calculating a pattern profile by moving the plurality of representative points in a first direction perpendicular to the surface of the substrate and a second direction perpendicular to the first direction; and repeating the steps of calculating the optical image and calculating the pattern profile until a difference between width of a predetermined portion in the pattern and a desired width becomes not more than a predetermined value.

The following are the preferred aspects of the present invention. (1) The step of setting the plurality of representative points includes the sub-step of dividing the surface of the film into a mesh pattern having a width which keeps a desired precision, and setting lattice points of the mesh pattern as the plurality of representative points. (2) The width of the mesh pattern is not more than ⅒ that of a minimum profile of a profile after the process. (3) The plurality of representative points are moved in two directions defining an angle of 180° as the second direction. (4) The plurality of representative points are moved in at least eight moving directions as the second direction. (5) The film is a photosensitive resin layer which is exposed in a desired pattern. The step of processing the photosensitive resin layer includes the step of performing a developing process. (6) The step of moving the representative points in the first and second directions includes the sub-step of moving the representative points while wet etching is used as a method of processing the film. In this case, an etching mask having a desired pattern is formed on the surface of the processed film.

According to the present invention, a plurality of points, as start points in a developing process or the like, are set on a surface of a film to be processed, and the directions in which the process should progress are limited to directions perpendicular and parallel to the substrate. The loci of the plurality of points are regarded as paths, and an envelope or surface for all the paths is obtained. With this operation, the profile of the film after the process can be accurately predicted. In this case, since the directions in which the process should progress are limited to the directions perpendicular and parallel to the substrate, the calculation time is very short. More specifically, a precision equal or close to that in the conventional distribution function method can be obtained at a calculation cost almost equal to that in the conventional simple ray-tracing model. According to the present invention, therefore, the two- or three-dimensional profile of a film to be processed can be predicted with a desired precision in a short period of time.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 4A and 4B are views respectively showing contour patterns obtained at different post-development times in the first embodiment and conventional methods;

FIGS. 5A and 5B are views respectively showing contour patterns obtained at different post-development times in the first embodiment and conventional methods;

FIGS. 8A to 8C are views respectively showing contour patterns in the second embodiment;

DETAILED DESCRIPTION OF THE PREFERRED EMBODIMENTS

Embodiments of the present invention will be described below with reference to the accompanying drawings.

FIGS. 1 to 5B are views for explaining a resist profile simulation method according to the first embodiment of the present invention.

Figure 1:
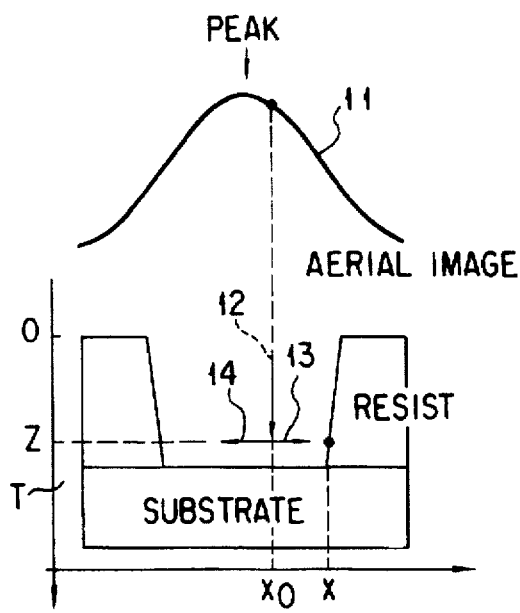
FIG. 1 is a graph showing an aerial image and a developing direction in exposing/developing a resist to explain the embodiment of the present invention.
Figure 2:
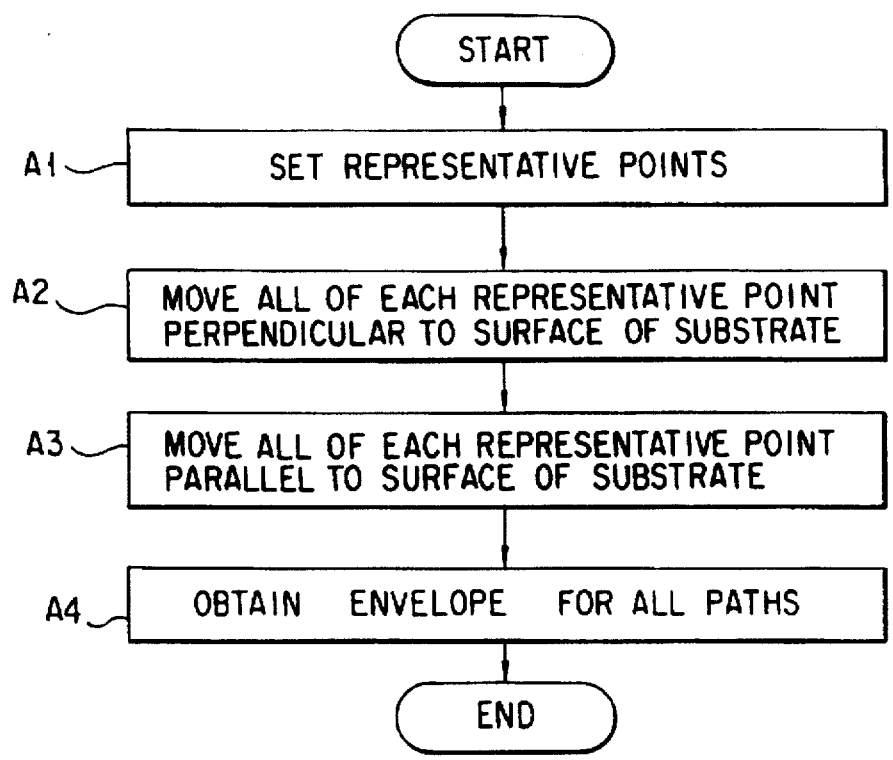
FIG. 2 is a flow chart showing an operation of the present invention.

FIG. 1 shows an aerial image 11 and developing directions 12 to 14 in a case wherein a resist is exposed/developed. Referring to FIG. 1, the developing direction 12 is a direction perpendicular to a substrate surface, and the developing directions 13 and 14 are directions parallel to the substrate surface. FIG. 2 is a flow chart showing an operation based on the method of the present invention.

First of all, the aerial image 11 of a mask pattern which is formed after it is transmitted through an optical projection system is calculated, and a resist is divided into a mesh pattern having a width ⅒ or less the L/S (line/space). The lattice points of the mesh pattern are set as representative points (step A1). Assume that no light intensity distribution change occurs in the direction of film thickness, and the light intensity distribution in the z direction is equal to the aerial image 11.

Figure 3:
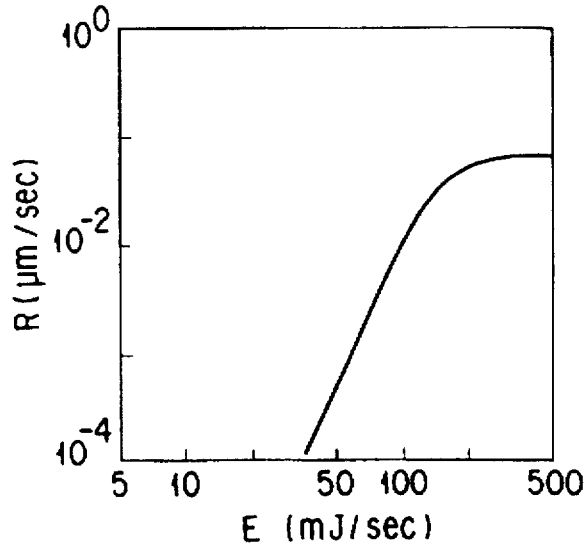
FIG. 3 is a graph showing the resolution velocity curve of a resist use in the first embodiment.

A dissolution ratio distribution R(x, z) in the resist is obtained according to the dissolution rate curve representing the dissolution characteristics of the resist in FIG. 3. Development is made to progress in the direction 12 of film thickness (z direction) from each representative point (x=x0, z=0) on the surface of the resist before development (step A2). At this time, a time t1 required to make development progress by z in the direction of film thickness is given by:

$$t1 = \int_0^Z dz'/R(X0,z')$$

After development progresses in the direction of film thickness by z, development is made to progress in a direction parallel to the substrate (step A3). At this time, in one dimension, development is made to progress in two directions like the directions 13 and 14 which define an angle of 180° in FIG. 1. At this time, a time t2 required for development to progress from x=x0 to x=x' is given by:

$$t2 = \int_{X0}^{X'} dx'/R(X,z)$$

As paths for making t1+t2 constant (developing time), paths having all start points (representative points) and all points from z=0 to z=T as points at which the developing direction is switched are obtained.

An envelope for all the paths obtained in this manner represents a resist profile after development (step A4).

The broken lines in FIG. 4B show the result obtained by changing the developing time for a small pattern (exposure wavelength=365 nm, numerical aperture=0.5, coherence factor=0.6, obscuration ratio=0.67, and 0.35 μm L/S) 10 seconds at a time. For comparison, the sold lines in FIG. 4B show the result (distribution function model) obtained by obtaining an envelope by solving the following equation using a distribution function C(x, y, z, t). The developing time is changed 10 seconds at a time.

$$\partial x(x,y,z,t)/\partial t + R(x,y,z)|\nabla C(x,y,z,t)|=0$$

The broken lines in FIG. 4A show the result obtained by changing the developing time 10 seconds at a time in a case (simple ray-tracing model) wherein the start point of development is limited to the point at which the dissolution ratio is highest. The solid lines in FIG. 4A show the result obtained by using the distribution function model.

FIGS. 5A and 5B show the results obtained by changing the developing time for a large pattern (exposure wavelength=365 nm, numerical aperture=0.5, coherence factor=0.6, obscuration ratio=0.67, and 1.0 μm L/S) five seconds at a time. The solid lines in FIGS. 5A and 5B represent the results obtained by using the distribution function model. The broken lines in FIG. 5A show the result obtained by using the simple ray-tracing model. The broken lines in FIG. 5B shows the result obtained in the present invention.

When the developing time is short or a large pattern is used, the simple ray-tracing model greatly deviates from the distribution function model. In contrast to this, the result in this embodiment is close to the distribution function model. In particular, the finish dimensional error on the substrate is 1% or less, exhibiting a high degree of coincidence.

In addition, by performing calculation only in the case of z=T, only the resolution limit of the resist can be calculated. In this embodiment, the light intensity distribution is assumed to be constant in the direction of film thickness. However, the present invention is not limited to this. For example, a light intensity distribution in the resist film direction may be calculated on the basis of the defocus amount, reflection from the underlying layer, and the like.

As described above, according to this embodiment, a resist shaft after development can be accurately calculated in a very short period of time. That is, a precision equal or similar to that in the conventional distribution function method can be obtained at a calculation cost almost equal to that in the conventional simple ray-tracing model. For this reason, exposure conditions and a mask pattern which are required to finish a desired pattern to have a predetermined depth of focus can be obtained at a high velocity.

The second embodiment of the present invention will be described next with reference to FIGS. 6A to 8. This embodiment relates to a method of calculating resist profiles based on two-dimensional mask patterns like those shown in FIGS. 6A and 6B.

Figure 6A:
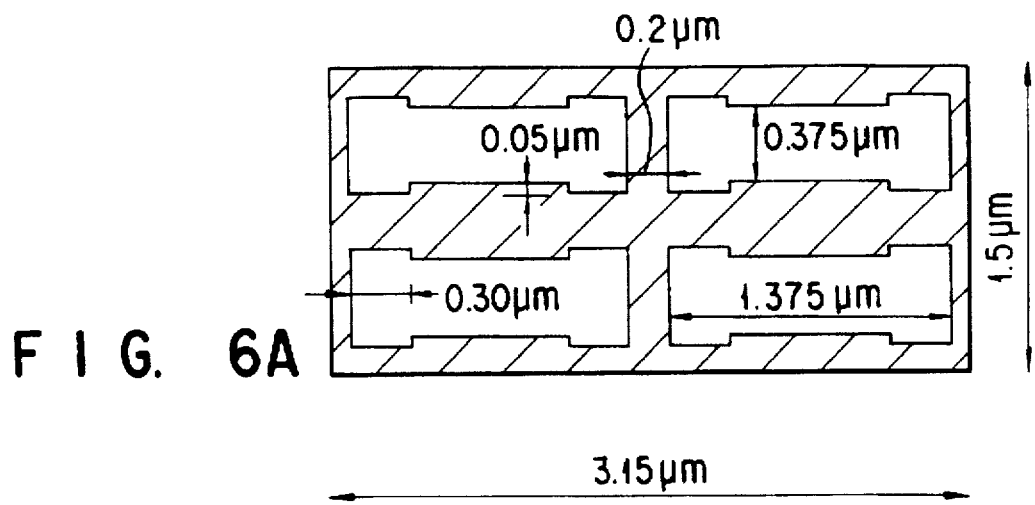
FIGS. 6A and 6B are views showing mask pattern profiles used in the second embodiment.
Figure 6B:
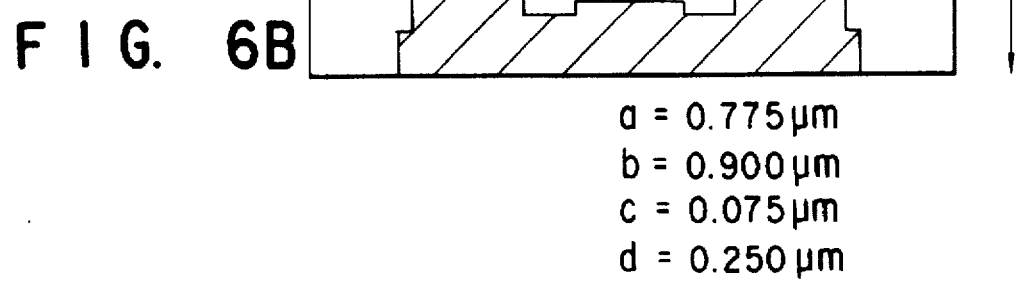

Two-dimensional aerial images based on the mask patterns in FIGS. 6A and 6B are calculated. Assume that the repetitive pattern in FIG. 6A corresponds to an exposure wavelength of 365 nm, a numerical aperture of 0.63, a coherence factor of 0.54, and a obscuration ratio of 0.0, and the repetitive pattern in FIG. 6B corresponds to an exposure wavelength of 365 nm, a numerical aperture of 0.57, a coherence factor of 0.6, and a obscuration ratio of 0.0.

Similar to the first embodiment, the light intensity distribution in the resist film thickness direction is ignored, and the light intensity distribution in the direction of film thickness is assumed to be constant. A dissolution ratio distribution is obtained from the dissolution ratio characteristics in FIG. 3. Development is started from all points on the resist surface before development, and is made to progress in the direction of film thickness first, and then in directions parallel to the substrate, as in the first embodiment, thereby obtaining envelopes.

Figure 7A:
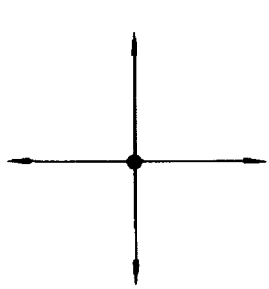
FIGS. 7A to 7C are views showing selected directions parallel to a substrate in the second embodiment.
Figure 7B:
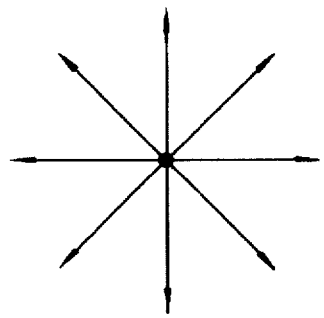
Figure 7C:
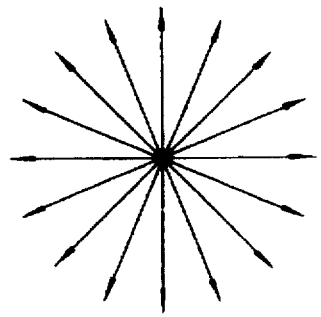

Although the number of directions parallel to the substrate is infinite, four directions (FIG. 7A), eight directions (FIG. 7B), and 16 directions (FIG. 7C) are radially set at equal angular intervals, as shown in FIGS. 7A to 7C. FIGS. 8A to 8C respectively show the results, in superposed states, obtained for z=T and by using distribution functions.

The broken lines in FIGS. 8A to 8C show the results obtained in this embodiment; and the solid lines outside the broken lines, the results obtained by the distribution function model. FIG. 8A shows the case of four directions; FIG. 8B, the case of eight directions; and FIG. 8C, the case of 16 directions. Reference numerals 7aA, 7bA, and 7cA respectively denote the interfaces of the bottom portions of resists which are obtained when a mask pattern A is used; and 7aB, 7bB, and 7cB, the interfaces of the bottom portions of resists which are obtained when a mask pattern B is used.

Referring to FIG. 8A, the result obtained by the distribution function model and the result in this embodiment slightly deviate from each other. Referring to FIGS. 8B and 8C, the results obtained by the distribution function model and the results in the embodiment coincide with each other, and the broken lines and the solid lines are superposed on each other. That is, the results obtained when eight or more parallel directions are set exhibit high degrees of coincidence with respect to the results obtained by the distribution function model. It is seen, therefore, that at least eight parallel directions need only be set.

In addition, by performing calculation only in the case of z=T, only the resolution limit of the resist can be calculated. In this embodiment, the light intensity distribution is assumed to be constant in the direction of film thickness. However, the present invention is not limited to this. For example, a light intensity distribution in the resist film direction may be calculated on the basis of the defocus amount, reflection from the underlying layer, and the like.

Figure 9:
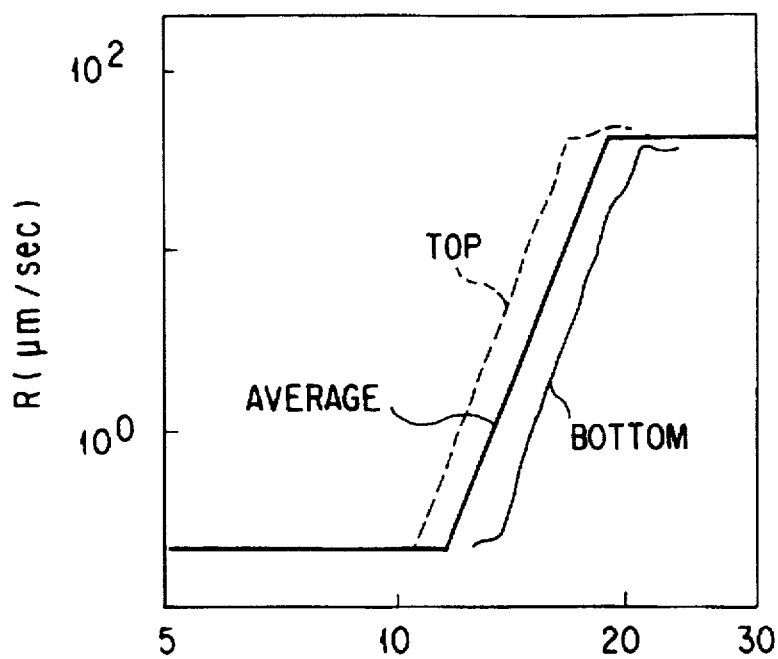
FIG. 9 is a graph showing the dissolution rate curve of a resist used in the third embodiment.

The third embodiment of the present invention will be described next with reference to FIGS. 9 and 10. A calculation method in the use of a resist having a large resolution velocity distribution in the direction of film thickness as shown FIG. 9 will be described.

When only the finish dimensions of a bottom portion are to be calculated, the through dimensions can be considered to be zero if development does not reach the substrate. In this calculation, only a case wherein development reaches the substrate will be considered. A time tT required for development to reach the substrate is given by:

$$tT = \int_0^T dz/R(x,z)$$

The time tT can therefore be replaced with a value obtained by averaging a dissolution ratio distribution R(x, z) in the direction of film thickness:

$$Rave(x)=T/tT$$

In addition, when development progresses in horizontal directions, a resolution velocity Rbottom (x) near the bottom portion is used.

Figure 10:
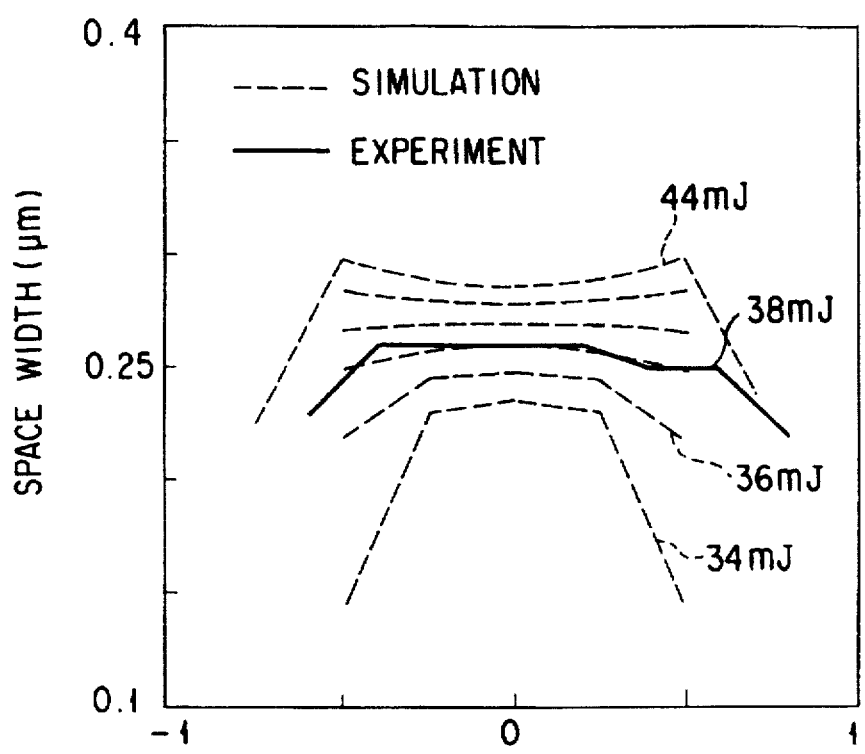
FIG. 10 is a graph showing a pattern exposure result and a calculation result in the third embodiment.

FIG. 10 shows the exposure result of a 0.25-μm L/S pattern (exposure wavelength=365 nm, numerical aperture= 0.5, coherence factor=0.5, and obscuration ratio=0.0) and the calculation result. As is apparent from FIG. 10, the experiment result and the simulation result (exposure=38 mJ) exhibit a high degree of coincidence.

Figure 11:
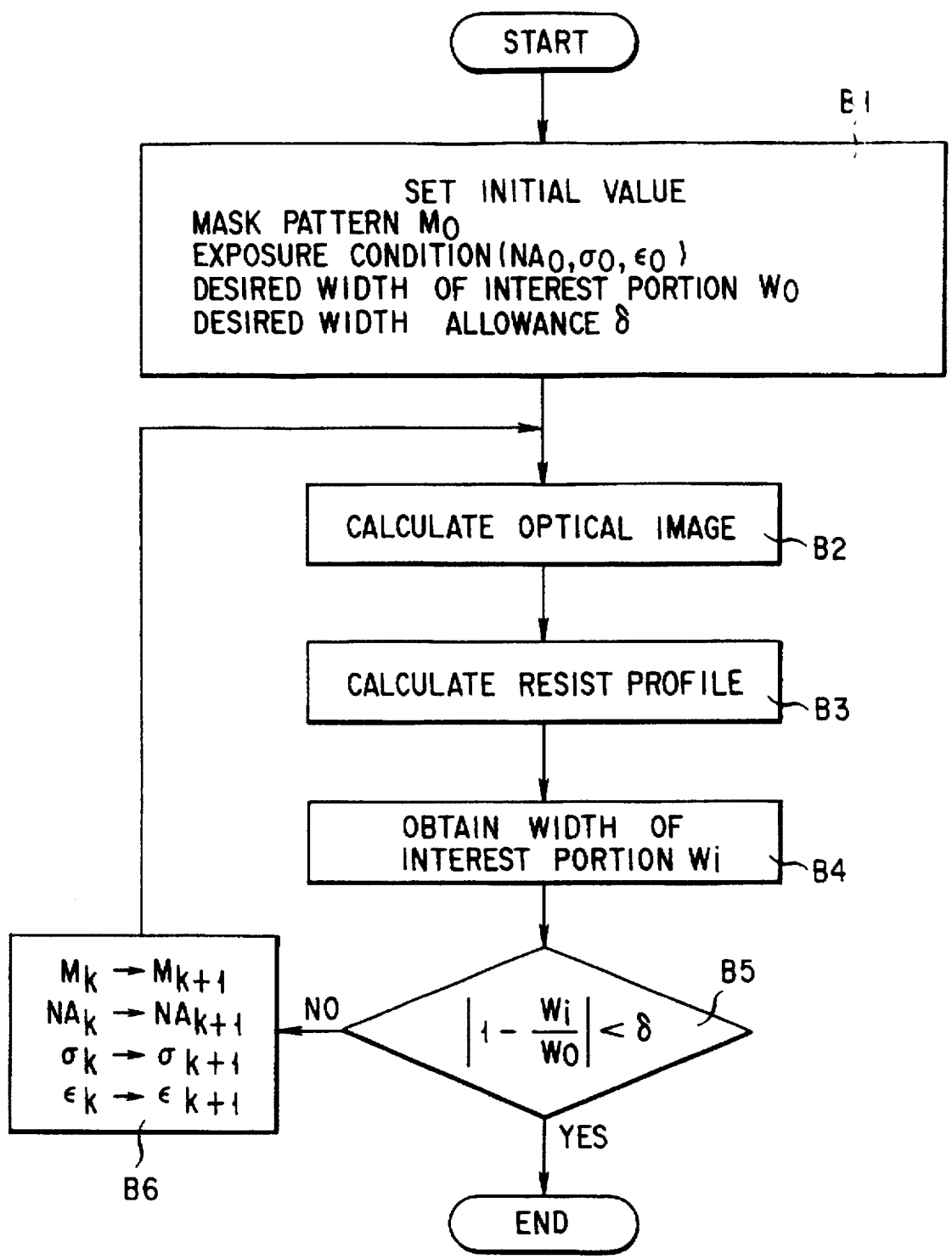
FIG. 11 is a flowchart showing an operation of the third embodiment.

The fourth embodiment in which a mask pattern is designed by using a profile simulation of the present invention will be described. FIG. 11 is a flow chart showing a mask pattern design method according to the fourth embodiment.

As initial conditions, a mask pattern M0, exposure conditions (NA0, ε0, σ0), a desired width w0 of a portion of interest, a desired width allowance δ, and the like are set (step B1).

An optical image under the initial conditions is calculated (step B2).

When a desired optical image is obtained, a profile simulation is performed according to the first to third embodiments to calculate a resist profile (step B3).

In this case, a width Wi of the interest portion is obtained, and it is checked whether the relative difference between width Wi and desired width W0|1−W0/Wi| is smaller than the desired width allowance δ(steps B4 and B5).

If it is determined in step B5 that the width Wi is smaller than the desired width, the design calculation is completed. Otherwise, the exposure conditions and the like are changed, and the flow returns to step B2 (step B6).

A mask pattern can be designed in the above manner. According to the mask pattern design method of this embodiment, since the profile simulations in the first to third embodiments can be used without any modifications, a mask pattern having a desired precision can be designed in a short period of time. The fourth embodiment has exemplified the mask pattern. As is apparent, however, the present invention is not limited to a mask pattern, and can be applied to a pattern design method using wet etching, dry etching, or the like.

The present invention is not limited to the above embodiments. The embodiments have exemplified the solution development of a resist in photolithography. However, the present invention is not limited to photolithography, and can be applied to solution development of a resist in electron beam lithography, X-ray lithography, or the like, in which the relationship between the exposure and the dissolution ratio is known.

A film to be processed is not limited to a resist either. The present invention may be applied to a thin film to be processed by wet etching. In addition, the present invention is effectively applied to wet etching, in particular. In this case, it suffices if the etching rate of a portion, exposed in a mask pattern opening, of a film to be processed is known at each position in the planar direction.

Various other changes and modifications can be made within the spirit and scope of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A profile simulation method for predicting an after processing profile of a surface of a film mounted on a substrate, wherein said film is to be processed using isotropic etching, said profile simulation method comprising the steps of:

setting a plurality of representative points on an unprocessed surface of the film;

moving the plurality of representative points in a first direction perpendicular to the unprocessed surface of the film in accordance with processing velocities at the plurality of representative points;

switching the moving direction of the representative points from the first direction to at least one second direction parallel to the unprocessed surface of the film and moving the plurality of representative points in the at least one second direction in accordance with processing velocities at the plurality of representative points; and setting all loci of the plurality of representative points which have moved from the first direction to the at least one second direction in a predetermined processing time as paths and obtaining an envelope or surface for all the paths as the after processing profile.

2. The method according to claim 1, wherein the step of setting the plurality of representative points includes the sub-step of dividing the surface of the film into a mesh pattern having a width which keeps a desired precision, and setting lattice points of the mesh pattern as the plurality of representative points.

3. The method according to claim 2, wherein the width of the mesh pattern is not more than 1/10 that of a minimum profile of a profile after the process.

4. The method according to claim 1, wherein the plurality of representative points are moved in two directions parallel to the unprocessed surface, said two directions defining an angle of 180° relative to each other.

5. The method according to claim 1, wherein the plurality of representative points are moved in at least eight moving directions all parallel to the unprocessed surface.

6. The method according to claim 1, wherein the film is a photosensitive resin layer which is exposed in a desired pattern.

7. The method according to claim 1, wherein the step of moving the representative points in the first direction and the at least one second direction includes the sub-step of moving the representative points to simulate wet etching as the isotropic etching for processing the film.

8. The profile simulation method according to claim 1, wherein the isotropic etching comprises wet etching.

9. A pattern design method comprising the steps of:

inputting a profile of a desired pattern to be formed on a substrate;

calculating an optical image of the desired pattern on the basis of the profile of the desired pattern;

setting a plurality of representative points on an unprocessed surface of the substrate on the basis of the calculated optical image, simulating an after processing pattern profile by moving the plurality of representative points in a first direction perpendicular to the surface of the substrate and in at least one second direction in a plane perpendicular to the first direction; and repeating the steps of calculating the optical image and simulating the after processing pattern profile until a difference between a width of a predetermined portion in the after processing pattern profile and a desired width becomes not more than a predetermined value.

10. The pattern design method according to claim 9, wherein the isotropic etching comprises wet etching.

11. A profile simulation method for predicting an after processing profile of an unprocessed surface of a photosensitive resin layer which is to undergo isotropic etching of the photosensitive resin layer, the photosensitive resin layer being formed on a substrate and containing an exposed desired pattern, said profile simulation method comprising the steps of:

setting a plurality of representative points on the unprocessed surface of the photosensitive resin layer;

moving the plurality of representative points in a first direction perpendicular to the unprocessed surface of the photosensitive resin layer in accordance with processing velocities at the plurality of representative points;

switching the moving direction of the representative points from the first direction to at least eight directions parallel to the unprocessed surface of the photosensitive resin layer in accordance with processing velocities at the plurality of representative points; and setting all loci of the plurality of representative points which have moved from the first direction to the at least eight directions in a predetermined processing time as paths and obtaining an envelope or surface for all the paths as the after processing simulation profile.

12. The profile simulation method according to claim 11, wherein the isotropic etching comprises wet etching.

* * * * *

UNITED STATES PATENT AND TRADEMARK OFFICE
CERTIFICATE OF CORRECTION

PATENT NO.   : 5,745,388
DATED        : April 28, 1998
INVENTOR(S)  : Shoji MIMOTOGI, et al.

It is certified that error appears in the above-identified patent and that said Letters Patent is hereby corrected as shown below:

On the title page, Item [30] Foreign Application Priority Data is incorrect. It should read:

--Nov. 8, 1994 [JP]  Japan................ 6-273534--

Signed and Sealed this

Eighth Day of September, 1998

Attest:

BRUCE LEHMAN

*Attesting Officer*          *Commissioner of Patents and Trademarks*